(12) United States Patent
Batra et al.

(10) Patent No.: US 7,005,697 B2
(45) Date of Patent: Feb. 28, 2006

(54) METHOD OF FORMING A NON-VOLATILE ELECTRON STORAGE MEMORY AND THE RESULTING DEVICE

(75) Inventors: Shubneesh Batra, Boise, ID (US); Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 19 days.

(21) Appl. No.: 10/175,861

(22) Filed: Jun. 21, 2002

(65) Prior Publication Data

US 2003/0235064 A1  Dec. 25, 2003

(51) Int. Cl.
*H01L 29/788* (2006.01)

(52) U.S. Cl. ...................... 257/315; 257/410; 257/412; 438/211; 438/257; 438/593; 438/686; 977/DIG. 1

(58) Field of Classification Search ................ 257/310, 257/410, 411, 406; 438/763, 216, 240, 287, 438/585, 591; 977/DIG. 1
See application file for complete search history.

(56) References Cited

U.S. PATENT DOCUMENTS

| | | | |
|---|---|---|---|
| 5,511,020 A * | 4/1996 | Hu et al. ................ | 365/185.28 |
| 5,707,898 A | 1/1998 | Keller et al. | |
| 6,054,349 A * | 4/2000 | Nakajima et al. ........... | 438/257 |
| 6,141,260 A | 10/2000 | Ahn et al. | |
| 6,285,055 B1 * | 9/2001 | Gosain et al. .............. | 257/317 |
| 6,310,376 B1 * | 10/2001 | Ueda et al. ................. | 257/315 |
| 6,424,004 B1 * | 7/2002 | Kim et al. .................. | 257/321 |
| 6,531,731 B1 * | 3/2003 | Jones et al. ................. | 257/314 |
| 6,573,193 B1 * | 6/2003 | Yu et al. ..................... | 438/770 |
| 6,753,568 B1 * | 6/2004 | Nakazato et al. ........... | 257/314 |

* cited by examiner

*Primary Examiner*—Tom Thomas
*Assistant Examiner*—José R. Díaz
(74) *Attorney, Agent, or Firm*—Dickstein Shapiro Morin & Oshinsky LLP

(57) ABSTRACT

The invention provides a method of forming an electron memory storage device and the resulting device. The device comprises a gate structure which, in form, comprises a first gate insulating layer formed over a semiconductor substrate, a self-forming electron trapping layer of noble metal nanocrystals formed over the first gate insulating layer, a second gate insulating layer formed over the electron trapping layer, a gate electrode formed over the second gate insulating layer, and source and drain regions formed on opposite sides of the gate structure.

38 Claims, 5 Drawing Sheets

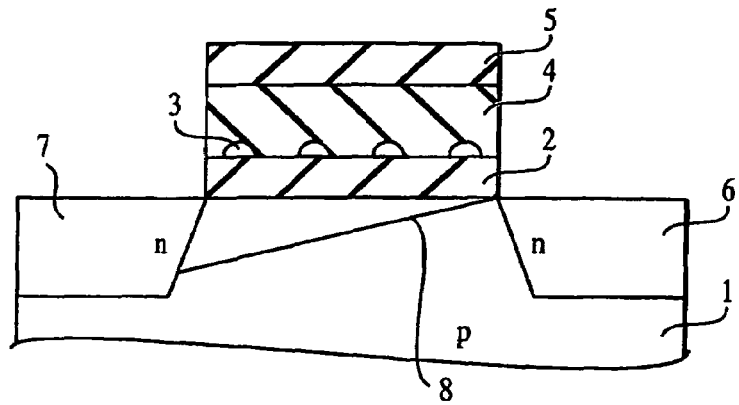
FIG. 1
PRIOR ART
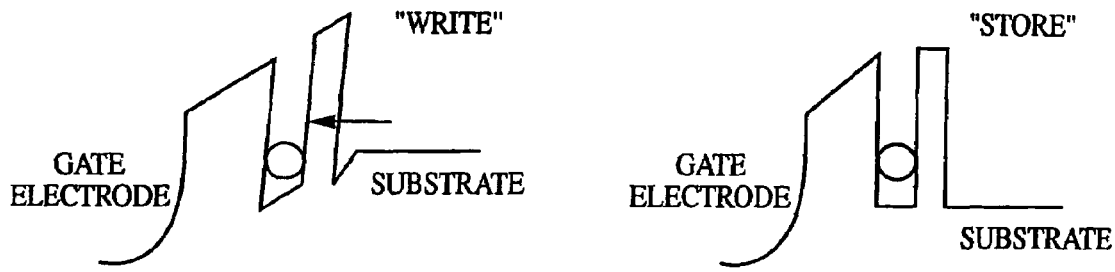
FIG. 2A
PRIOR ART
FIG. 2B
PRIOR ART
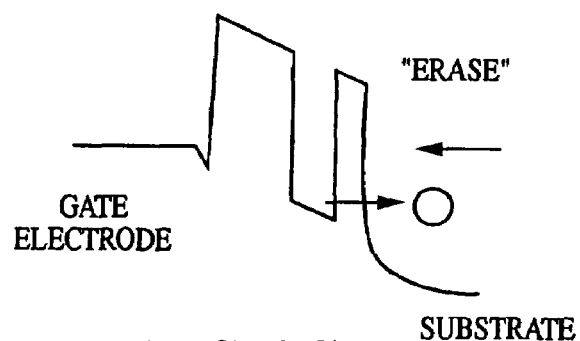
FIG. 2C
PRIOR ART

METHOD OF FORMING A NON-VOLATILE ELECTRON STORAGE MEMORY AND THE RESULTING DEVICE

FIELD OF INVENTION

This invention relates to integrated circuit memory devices, and, more particularly, to a method and device for providing high-density, high-storage capacity, low-power, non-volatile memory devices.

BACKGROUND OF THE INVENTION

Non-volatile memory devices which store electrons in nano-crystals instead of floating gates, are presently of great interest, due to potential advantages in memory cell size and power dissipation, compared to memory technologies currently in use. The use of nano-crystals for electron storage will provide greater reliability and low-voltage operation. Research in this area is reported in the article "Volatile and Non-Volatile Memories in Silicon with Nano-Crystal Storage" by Tiwasi et al., IEEE, IEDM, 1995, pgs. 521–524, the disclosure of which is incorporated herein by reference.

FIG. 1 is a sectional view illustrating a floating-gate n-channel MOS electron memory device. In the figure, reference numeral 1 denotes a silicon (Si) substrate, reference numeral 2 a tunnel gate oxide layer, reference numeral 4 a control gate oxide layer, reference numeral 5 a control gate electrode, reference numeral 6 a source region, reference numeral 7 a drain region, reference numeral 8 an inversion layer, and reference numeral 3 silicon nano-crystals. This device is characterized in that silicon nano-crystals 3 with a dimension, for example, of less than about 5 nm are provided between a tunnel oxide of 1.5 nm (or less) and control oxide of 7 nm or less. If alternate high dielectric constant dielectrics are employed, the physical film thickness can be greater, as the "effective" thickness will be less due to the higher dielectric constant of the dielectric material. A high dielectric constant dielectric is one which has a dielectric constant greater than silicon dioxide.

During programming of the device, electrons contained in the inversion layer 8 tunnel into the silicon nano-crystals 3 on the tunnel oxide layer 2 when the gate is forward biased with respect to the source and drain. The resulting stored charge in the silicon nano-crystals 3 effectively shifts the threshold voltage of the device to a more positive potential as the control gate now has to overcome the effects of this change. The gate can also be programmed by a hot electron technique typically used in flash memory. The state of electrons in the silicon nano-crystals 3 can be sensed by sensing a change in the current flowing through the inversion layer 8 with respect to the gate voltage.

FIGS. 2A, 2B and 2C are views illustrating changes in the conduction band of the above-described device. When a positive voltage has been applied to the gate with respect to the source and drain regions, an electron is transmitted and accumulated into the silicon nano-crystals 3 from the inversion layer 8 via the tunnel oxide layer 2, as is shown in FIG. 2A ("Write" state). Even if the application of the voltage to the gate electrode 5 is removed, the electron is retained in the silicon nano-crystals 3, as is shown in FIG. 2B ("Store" state). The stored electron increases the threshold voltage of the transistor as it screens the control gate voltage. On the other hand, when a negative voltage has been applied to the gate with respect to the source and drain regions, the electron accumulated in the silicon nano-crystals is discharged to the substrate side via the tunnel oxide layer 2, as is shown in FIG. 2C. In this state, the threshold voltage returns to its original value ("Erase" state).

As described above, an electron can be transmitted into, retained in, and discharged from the silicon nano-crystals 3, and the threshold voltage of the device varies depending upon whether or not electrons are accumulated in the silicon nano-crystals 3. Hence, this device can be used as a memory device.

In the conventional floating-gate device using the stored electron phenomenon, a low dielectric constant dielectric, such as $SiO_2$ is used as a gate oxide layer. The $SiO_2$ gate oxide has a dielectric constant of 3.9 which does not allow scaling and also does not permit low voltage operation. Also, depending on what control gate oxide is used and subsequent processing steps used, the silicon nano-crystals could oxidize, which would impede or destroy memory device operation. For example, if a high constant (high-K) dielectric, such as $Ta_2O_5$, is used as the control gate oxide to scale the gate threshold voltage for low voltage application, formation of the $Ta_2O_5$ control gate oxide could oxidize the silicon nano-crystals destroying the memory cell. The present invention enables integration of high constant dielectrics, which in turn allows for reduction of operating voltages.

SUMMARY OF THE INVENTION

The invention provides a method of forming a semiconductor device and the resulting device which mitigates the foregoing problems. The device comprises a gate structure having a first gate insulating layer formed over a semiconductor substrate and a electron trapping layer containing a noble metal formed over the first gate insulating layer. Preferably, the noble metal is formed of platinum, rhodium, or ruthenium which enables self-forming nano-crystals. The self-forming nano-crystals eliminate the need for costly mask steps to form the nano-crystals. Further, the gate structure includes a second gate insulating layer formed over the electron trapping layer. In a preferred embodiment of the invention, the first gate oxide is preferably $SiO_2$ (silicon dioxide), but a high dielectric constant advanced dielectric, such as $Ta_2O_5$ (tantalum oxide), $BaSrTiO_3$ (barium strontium titanate), $HfO_2$ (hafnium oxide), or $ZrO_2$ (zirconium oxide) can also be used. The gate structure further includes a gate electrode formed on the second gate insulating layer. Source and drain regions are provided in surface portions of the semiconductor substrate with the gate structure between them.

BRIEF DESCRIPTION OF THE DRAWINGS

The above advantages and features of the invention as well as others will be more clearly understood from the following detailed description which is provided in connection with the accompanying drawings.

FIG. 1 is a sectional view illustrating the structure of a conventional floating-gate device using the single electron effect;

FIGS. 2A–2C are views illustrating changes in the conduction band of the device of FIG. 1;

DETAILED DESCRIPTION OF THE INVENTION

In the following detailed description, reference is made to various exemplary embodiments of the invention. These embodiments are described with sufficient detail to enable those skilled in the art to practice the invention, and it is to be understood that other embodiments may be employed, and that structural and electrical changes may be made without departing from the spirit or scope of the invention. As the skilled person will readily appreciate, these figures are merely of an illustrative nature and are provided only to facilitate the explanation of various process steps. Accordingly, the relation between various feature sizes may not necessarily reflect the real situation. In addition, in reality, boundaries between specific portions of the device and between various layers may not be as sharp and precise as illustrated in these figures.

The term "substrate" used in the following description may include any semiconductor-based structure that has an exposed semiconductor surface. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium-arsenide. When reference is made to substrate in the following description, previous process steps may have been utilized to form regions or junctions in or on the base semiconductor or foundation.

Figure 3:
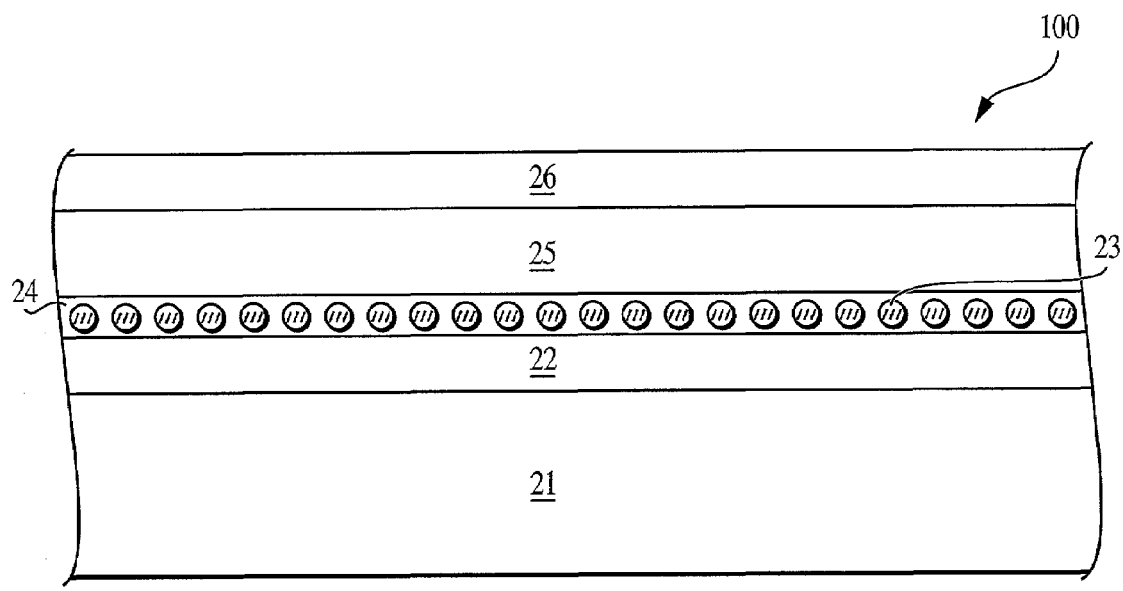
FIG. 3 is a sectional view illustrating the structure of a semiconductor device at a processing step in accordance with the invention.
Figure 5:
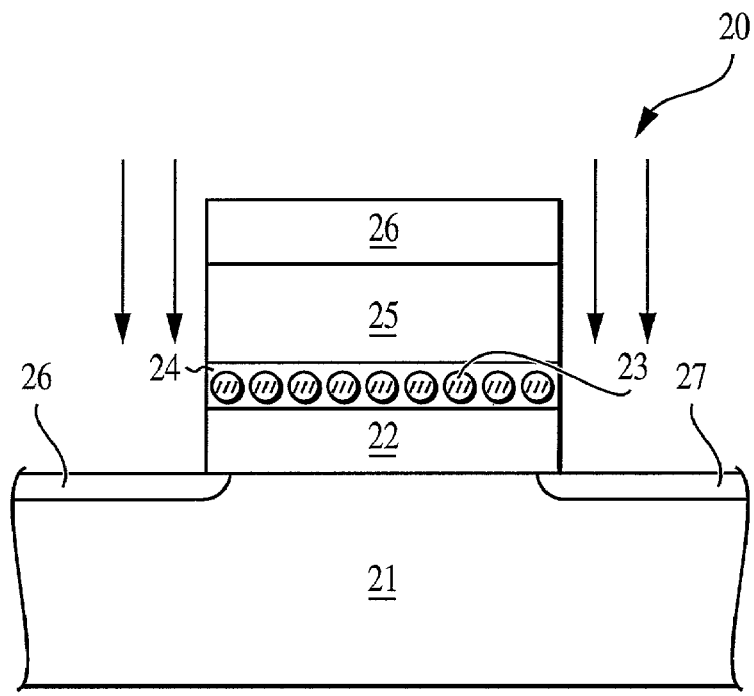
FIG. 5 shows the device of FIG. 3 at a fabrication step subsequent to that shown in FIG. 4.
Figure 6:
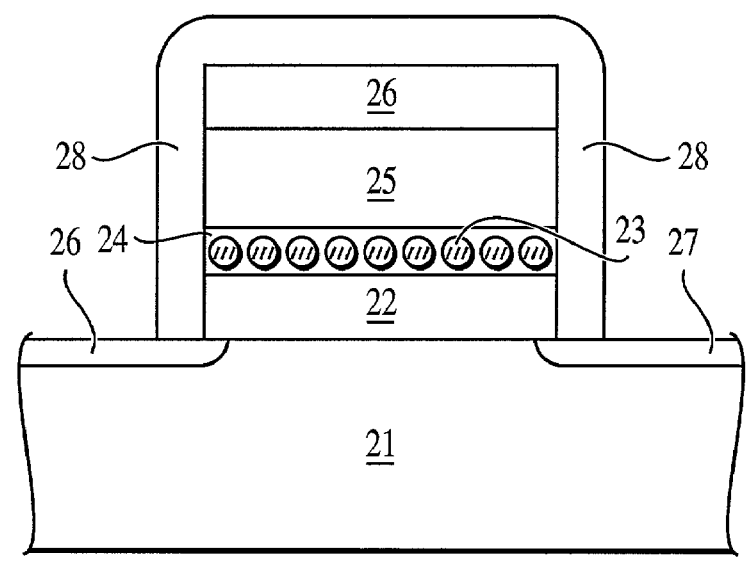
FIG. 6 shows the device of FIG. 3 at a fabrication step subsequent to that shown in FIG. 5.
Figure 7:
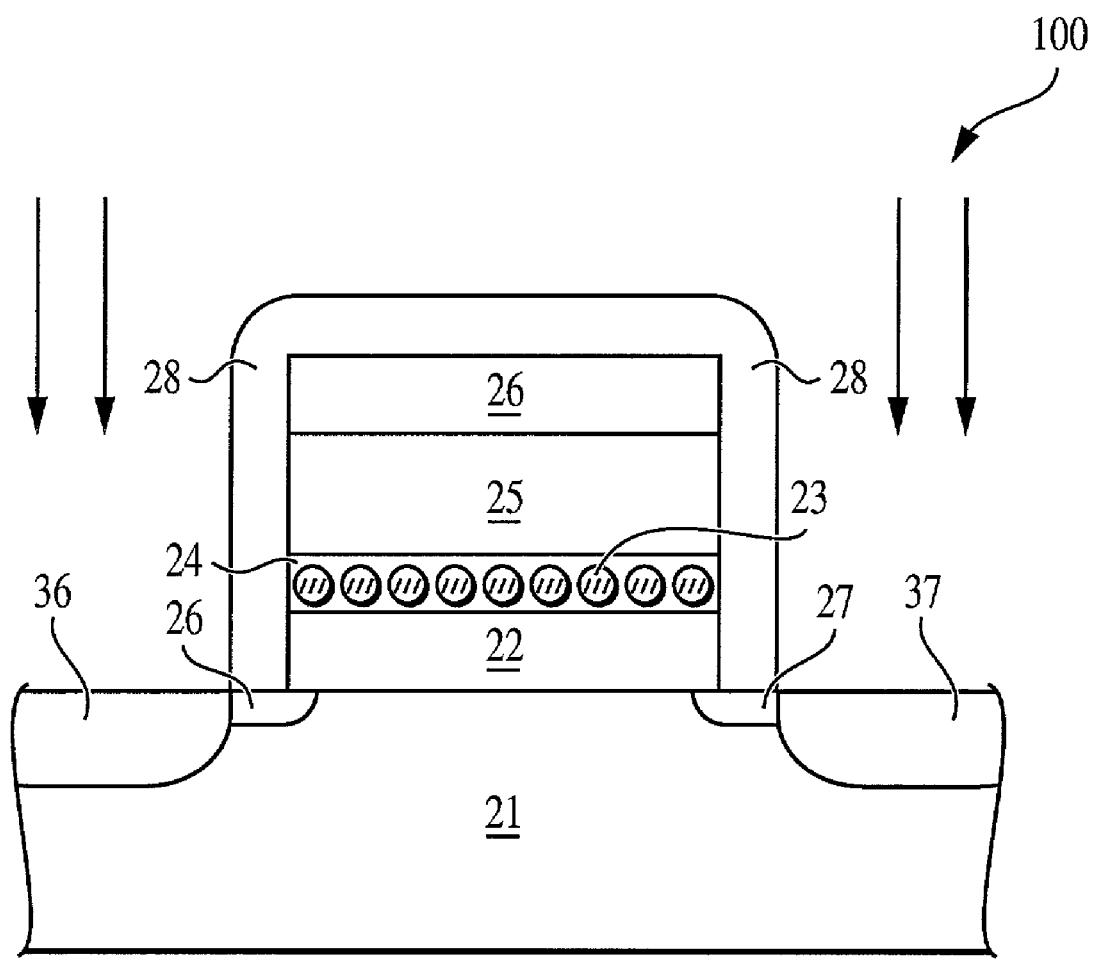
FIG. 7 shows the device of FIG. 3 at a fabrication step subsequent to that shown in FIG. 6.

Referring now to the drawings, where like elements are designated by like reference numerals, FIGS. 3 through 7 illustrate an exemplary embodiment of a method of fabricating a non-volatile electron storage memory device including an electron trapping layer comprising noble metal nano-crystals and the resulting device (FIG. 7). FIG. 3 depicts a substrate fragment of an electron storage device, generally indicated with reference numeral 100, shown at a step prior to patterning a gate structure. The device 100 includes a p-type silicon substrate 3 (for forming an n-channel storage device). Alternatively, an SOI (silicon-on-insulator) substrate may be used in place of the silicon substrate 3. A device region is formed on the silicon substrate 21 by conventional process steps. A tunnel oxide layer 22 (first gate insulating layer) is formed over the silicon substrate 21. The tunnel oxide layer 22 may be formed of any suitable insulating material and is preferably formed of silicon dioxide, a high constant dielectric, or a stack of layers including at least one barrier layer and at least one high constant dielectric layer. If a high constant dielectric layer is used, preferably a barrier layer (not shown) is formed between the high constant dielectric layer and the silicon substrate 3. The thickness of the tunnel oxide layer 22 depends upon the material selected and programming voltages used. For example, a tunnel oxide layer formed of silicon dioxide would preferably have a thickness of less than 2 nm.

Noble metal nano-crystals, preferably platinum (Pt), nano-crystals 23 and preferably having a size of less than about 5 nm thick, are provide over the tunnel oxide layer 22 by chemical vapor deposition (CVD). Platinum nano-crystals may also be deposited via atomic layer deposition (ALD) and physical vapor deposition (PVD) known in the art. Platinum nano-crystals are preferably deposited using a chemical vapor deposition process wherein, for example, (trimethyl)-methylcyclopentadienyl platinum (IV) is reacted with oxidizing gases such as $O_2$ and $N_2O$ at about 380–420° C. to deposit platinum on the tunnel oxide layer 22 which self-forms as nano-crystals 23 on the tunnel oxide layer 22. In addition to the deposition process, the substrate may be annealed at a temperature of from about 200° C. to about 800° C., preferably in the presence of $N_2$ or $O_2$ in a vacuum atmosphere, to convert the platinum to small nano-crystalline beads. Furthermore, the nano-crystals 23 may be composed of materials such as Rhodium (Rh) and Ruthenium (Ru), which upon oxidation to $RuO_2$ stays conductive utilizing the aforementioned processing steps. The nano-crystals 23 are used to shift the threshold voltage of the device by trapping electrons in the quantum wells created by the nano-crystals 23.

A gate oxide layer 24 (second gate insulating layer) is formed over the noble metal nano-crystals 23 by CVD. The nano-crystals 23 are formed to be separate and isolated crystals, thus the gate oxide layer 24 is formed interstitially between the nano-crystals 23. The gate oxide layer 24 preferably comprises an advanced dielectric, for example, $Ta_2O_5$, $BaSrTiO_3$, $HfO_2$, or $ZrO_2$, which have very high dielectric constants (about 25 or greater) when deposited. Advanced dielectric materials are useful for increasing the amount of energy at a given voltage that each device can store, thereby reducing operating voltages. As defined herein, an advanced dielectric is a dielectric which allows device scaling below 0.1 $\mu$m. Ideally, the noble metal nano-crystals 23 are non-reactive and do not oxidize to form a dielectric which could destabilize the memory structure as is the case with the prior art. The first and second gate insulating layer 22, 24, together along with the noble metal nano-crystals 23, comprise a composite dielectric layer. Although not shown, a barrier layer or silicon dioxide layer is preferably formed over the gate oxide layer 24 when the gate oxide layer comprises an advanced dielectric. A polysilicon gate layer 25 is deposited on the gate oxide layer 24, preferably by LPCVD, and an insulating layer 26 formed of silicon nitride is deposited on the gate layer 25. The polysilicon gate layer 25 may comprise combinations of polysilicon, tungsten, tungsten-nitride, polysilicon/tungsten-silicide, polysilicon/tungsten-silicide/tungsten, and polysilicon/tungsten-nitride/tungsten.

Figure 4:
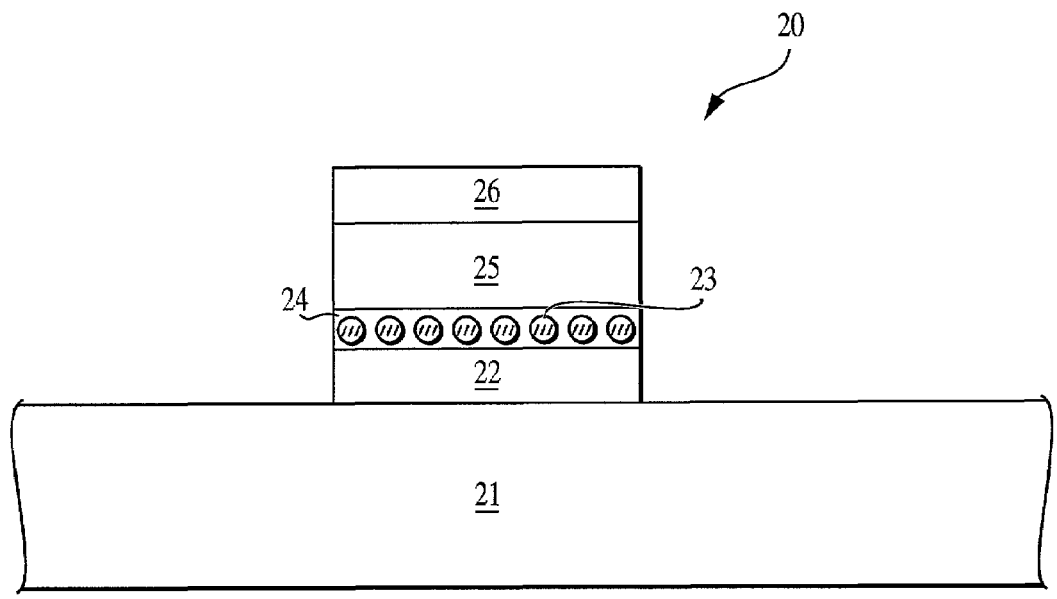
FIG. 4 shows the device of FIG. 3 at a fabrication step subsequent to that shown in FIG. 3.

Referring now to FIG. 4, the layers 22, 23, 24, 25, and 26 are then etch patterned into a gate stack 20.

Referring now to FIG. 5, after the gate stack 20 is formed a self-aligned LDD (lightly doped drain) implant (indicated by arrows) is performed on one or both sides of the gate stack 20 using the gate stack 20 as a mask to form LDD regions 26 and 27. FIG. 5 shows the situation where LDD implants are provided on both sides of gate stack 20.

Referring now to FIG. 6 an insulating layer is blanket deposited over the gate stack 20 and etched back to form side wall spacers 28. The sidewall spacers 28 are preferably formed of a nitride compound, for example, $(Si_3N_4)$. Nitride compounds are characterized by having etch stopping capabilities. The insulating layer that forms sidewall spacers 28 may be deposited by conventional techniques, for example, LPCVD and PECVD. Other preferred examples of an insulating layer material for the sidewall spacers 28 is $SiO_2$.

Referring now to FIG. 7, using the sidewall spacers 28 and the gate structure 20 as a mask, an n-type impurity is implanted into a surface of the substrate by ion implantation to form source and drain regions 36 and 37, which include LDD regions 26 and 27. The LDD implant may be angled. Also, a punch-through p-type implant may be performed. Subsequent conventional process steps are then used to connect the FIG. 7 transistor device to other fabricated structures.

The electron storage device 100 is efficiently fabricated and uses the noble metal nano-crystals 23 as the electron trapping layer. The formation of the nano-crystals 23 is more accurately controlled in the invention and the use of noble metal nano-crystals 23 allows for device integration with advanced high constant dielectrics such as $Ta_2O_5$, Ba $SrTiO_3$, $HfO_2$, and $ZrO_2$, resulting in thinner effective oxides. The use of these advanced dielectrics further allows reduction of operating voltages. Accordingly, the semiconductor device of the embodiment is suitable as a non-volatile memory and can be easily scaled for future technologies. The device can be used as an electron storage device which stores one electron per nano-crystal, or as a device which stores more than one electron per nano-crystal. Furthermore, a device according to the invention is more reliable in that if one of the nano-crystals fails, the other nano-crystals will not be affected.

Figure 8:
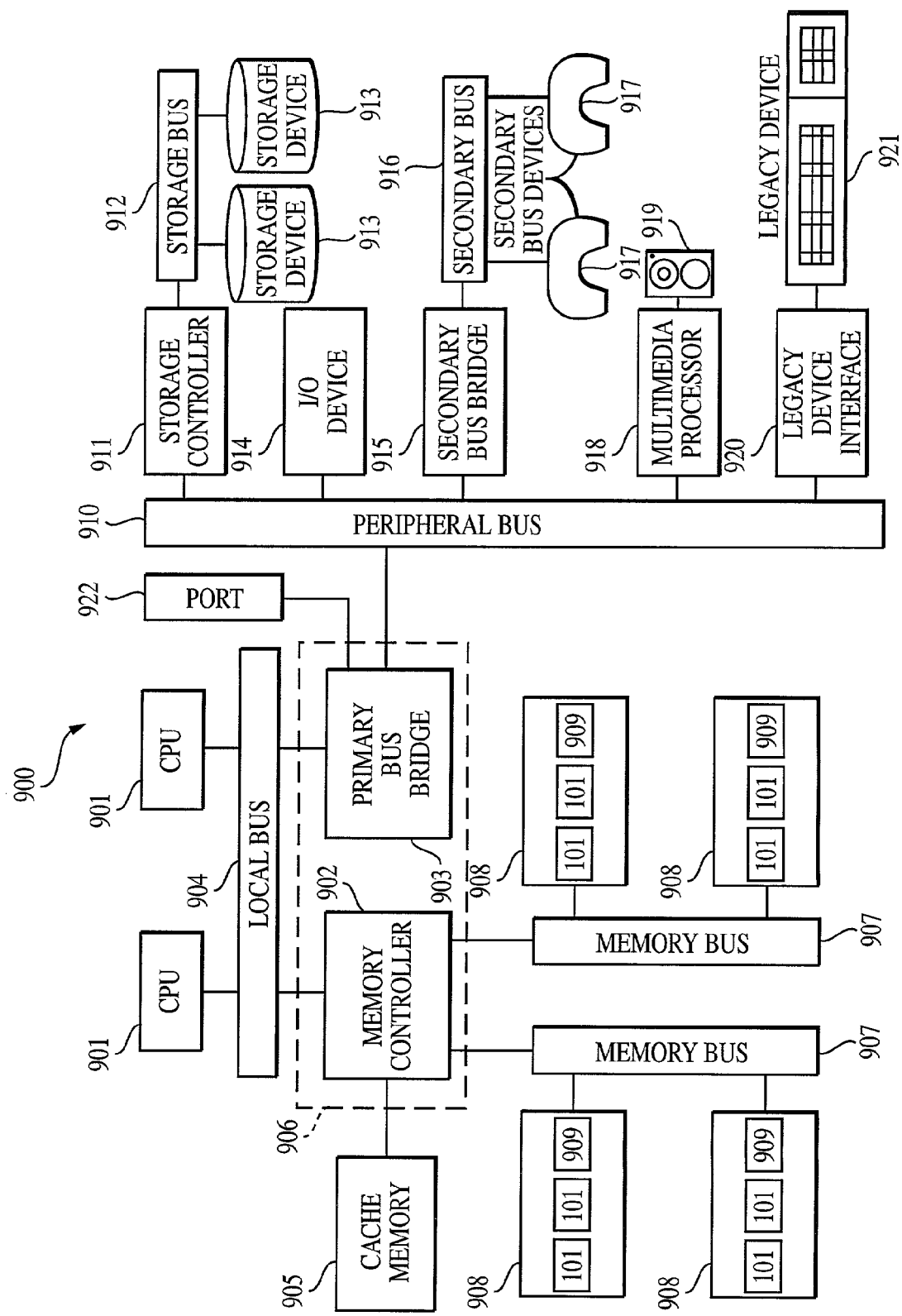
FIG. 8 shows a processor system having one or more memory devices that contains a computer electron storage device according to the invention as shown in FIG. 7 and in accordance with the invention.

The electron storage device 100 of the invention may be used as a non-volatile memory cell in a non-volatile memory device. FIG. 8 illustrates an exemplary processing system 900 which utilizes a non-volatile memory device 101 containing the electron storage device 100 of FIG. 7. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908, which include at least one memory device 101 of the invention. Alternatively, in a simplified system, the memory controller 902 may be omitted and the memory components directly coupled to one or more processors 901. The memory components 908 may be a memory card or a memory module. The memory components 908 may include one or more additional devices 909. For example, the additional device 909 might be a configuration memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 8 is only an exemplary processing system with which the invention may be used. While FIG. 8 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

The invention is not limited to the details of the illustrated embodiment. Accordingly, the above description and drawings are only to be considered illustrative of exemplary embodiments which achieve the features and advantages of the invention. Modifications and substitutions to specific process conditions and structures can be made without departing from the spirit and scope of the invention. Accordingly, the invention is not to be considered as being limited by the foregoing description and drawings, but is only limited by the scope of the appended claims.

What is claimed is:

1. A semiconductor device comprising:
    a gate structure comprising:
        a first gate insulating layer formed over a semiconductor substrate;
        an electron trapping layer over the first gate insulating layer, said trapping layer comprising dispersed noble metal nano-crystal beads covering said first gate insulating layer;
        a second gate insulating layer over said trapping layer, interstitially between said nano-crystal beads, and in contact with the first gate insulating layer, said second gate insulating layer comprising an advanced dielectric material;
        a gate electrode over the second gate insulating layer; and source and drain regions in surface portions of the semiconductor substrate on opposite sides of said gate structure.

2. The semiconductor device of claim 1 wherein said trapping layer comprises platinum.

3. The semiconductor device of claim 1 wherein said trapping layer comprises rhodium.

4. The semiconductor device of claim 1 wherein said trapping layer comprises ruthenium.

5. The semiconductor device of claim 1 further comprising a barrier layer over said second gate insulating layer.

6. The semiconductor device of claim 1 wherein said second gate insulating layer comprises $Ta_2O_5$.

7. The semiconductor device of claim 1 wherein said second gate insulating layer comprises $HfO_2$.

8. The semiconductor device of claim 1 wherein said second gate insulating layer comprises $ZrO_2$.

9. The semiconductor device of claim 1 wherein said second gate insulating layer comprises $BaSrTiO_3$.

10. The semiconductor device of claim 1 wherein said device is an electron storage memory device.

11. The semiconductor device of claim 1 wherein said device is configured to store a single electron per nano-crystal.

12. The semiconductor device of claim 10 wherein said device is configured to store more than one electron per nano-crystal.

13. The semiconductor device of claim 1 wherein said first gate insulating layer comprises $SiO_2$.

14. The semiconductor device of claim 1 wherein said first gate insulating layer comprises a high dielectric constant material.

15. The semiconductor device of claim 1 wherein said first gate insulating layer comprises a stack of layers, said stack of layers comprising at least one barrier layer under a high dielectric constant layer.

16. The semiconductor device of claim 1 wherein said second gate insulating layer comprises a stack of layers.

17. The semiconductor device of claim 1 wherein said second gate insulating layer comprises a silicon dioxide layer over said advanced dielectric material.

18. An electron storage device comprising:
a gate structure comprising:
   a tunneling oxide layer over a substrate, said tunneling oxide layer comprising a high dielectric constant material and a barrier layer between said high dielectric constant material and said substrate;
   an electron trapping layer comprising dispersed noble metal nano-crystal beads covering said tunneling oxide layer, said beads being non-reactive and substantially non-oxidizable;
   an insulating layer over said trapping layer, between said beads, and in contact with the tunneling oxide layer, said insulating layer comprising an advanced dielectric material selected from the group consisting of barium strontium titanate, hafnium oxide, and zirconium oxide;
   a barrier layer over said insulating layer;
   a gate electrode over said barrier layer, said gate electrode comprising a material selected from the group consisting of polysilicon, tungsten, tungsten-nitride, tungsten-silicide, and layered combinations thereof; and
source and drain regions in said substrate on opposite sides of said gate structure.

19. The device of claim 18 wherein said tunneling oxide layer comprises a stack of layers.

20. The device of claim 18 wherein said noble metal is platinum.

21. The device of claim 18 wherein said noble metal is rhodium.

22. The device of claim 18 wherein said noble metal is ruthenium.

23. The device of claim 18 wherein said insulating layer comprises $BaSrTiO_3$.

24. The device of claim 18 wherein said insulating layer comprises $HfO_2$.

25. The device of claim 18 wherein said insulating layer comprises $ZrO_2$.

26. The device of claim 18 wherein said insulating layer comprises at least one silicon dioxide layer over said advanced dielectric material.

27. A processor system comprising:
a processor; and
a memory device coupled to said processor, said memory device comprising at least one electron storage device, said electron storage device comprising:
   a gate structure comprising:
      a first gate insulating layer over a semiconductor substrate;
      an electron trapping layer over the first gate insulating layer, said trapping layer comprising dispersed noble metal nano-crystal beads covering said first gate insulating layer;
      a second gate insulating layer over said trapping layers, interstitially between said nano-crystal beads, and in contact with the first gate insulating layer, wherein said second gate insulating layer comprises an advanced dielectric material;
      a gate electrode over the second gate insulating layer; and
   source and drain regions in surface portions of the semiconductor substrate on opposite sides of said gate structure.

28. The system of claim 27 wherein said trapping layer comprises platinum.

29. The system of claim 27 wherein said trapping layer comprises rhodium.

30. The system of claim 27 wherein said trapping layer comprises ruthenium.

31. The system of claim 27 wherein said second gate insulating layer comprises $Ta_2O_5$.

32. The system of claim 27 wherein said second gate insulating layer comprises $BaSrTiO_3$.

33. The system of claim 27 wherein said second gate insulating layer comprises $HfO_2$.

34. The system of claim 27 wherein said second gate insulating layer comprises $ZrO_2$.

35. The semiconductor device of claim 27 wherein said first gate insulating layer comprises $SiO_2$.

36. The semiconductor device of claim 27 wherein said first gate insulating layer comprises a stack of layers, said stack of layers comprising at least one barrier layer under a high dielectric constant material.

37. The semiconductor device of claim 27 wherein said second gate insulating layer comprises a silicon dioxide layer over an advanced dielectric layer.

38. The semiconductor device of claim 27 wherein said second gate insulating layer comprises at least one barrier layer over at least one advanced dielectric layer.

* * * * *